United States Patent
Yang

(10) Patent No.: US 11,837,297 B2
(45) Date of Patent: Dec. 5, 2023

(54) SMART ERASE VERIFY IN NON-VOLATILE MEMORY STRUCTURES

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/344,135

(22) Filed: Jun. 10, 2021

(65) Prior Publication Data

US 2022/0399065 A1    Dec. 15, 2022

(51) Int. Cl.
| | |
|---|---|
| *G11C 16/34* | (2006.01) |
| *G11C 16/26* | (2006.01) |
| *G11C 16/16* | (2006.01) |

(52) U.S. Cl.
CPC .......... *G11C 16/3495* (2013.01); *G11C 16/16* (2013.01); *G11C 16/26* (2013.01); *G11C 16/3404* (2013.01); *G11C 16/3445* (2013.01)

(58) Field of Classification Search
CPC . G11C 16/0483; G11C 16/3495; G11C 16/16; G11C 16/26; G11C 16/3404; G11C 16/3445

See application file for complete search history.

(56) References Cited

U.S. PATENT DOCUMENTS

| | | | |
|---|---|---|---|
| 2015/0221379 A1* | 8/2015 | Aritome ................. | G11C 16/26 365/185.11 |
| 2019/0244673 A1* | 8/2019 | Yang ..................... | G11C 16/14 |

* cited by examiner

*Primary Examiner* — Alfredo Bermudez Lozada
(74) *Attorney, Agent, or Firm* — DICKINSON WRIGHT PLLC; Steven C. Hurles

(57) ABSTRACT

A method for dynamically adjusting an erase voltage level to be applied in a subsequent erase cycle, comprising: in a current erase cycle, initiating a current erase/verify loop by applying an initial stored erase voltage level according to an erase sequence in which each successive erase/verify loop is incremented by a pre-determined voltage amount, storing an erase/verify loop count, and determining whether the current erase cycle is complete according to a pass criterion. If the erase cycle is complete, a determination is made as to whether the stored erase/verify loop count equals a pre-defined threshold count. Further, if the stored count does not equal the pre-defined threshold count, the initial stored erase voltage level is adjusted such that, upon applying the adjusted erase voltage level in a subsequent erase cycle, an erase/verify loop count will now equal the pre-defined threshold count.

7 Claims, 15 Drawing Sheets

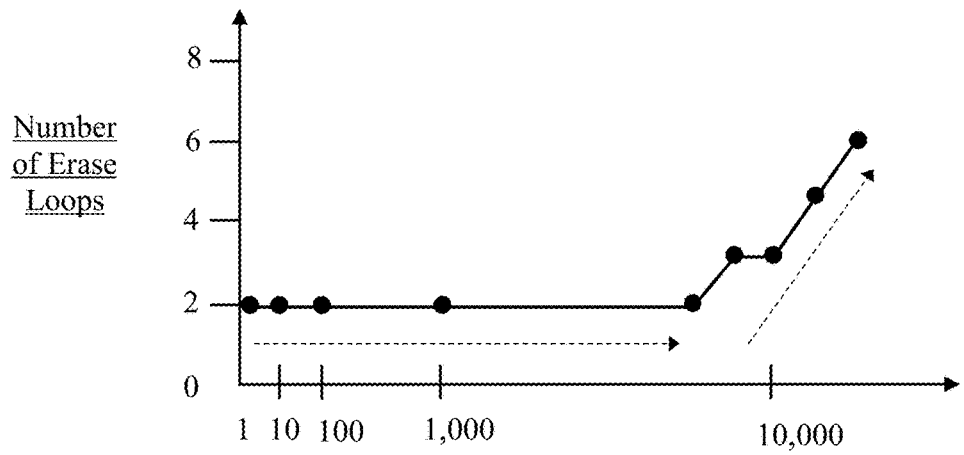
FIG. 12
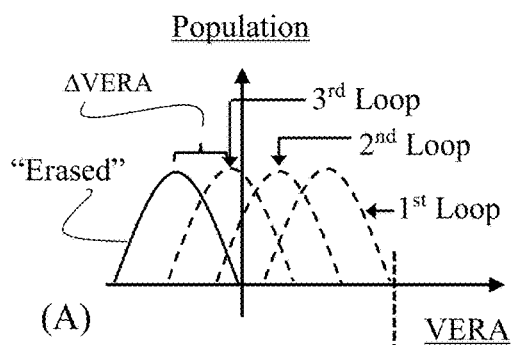
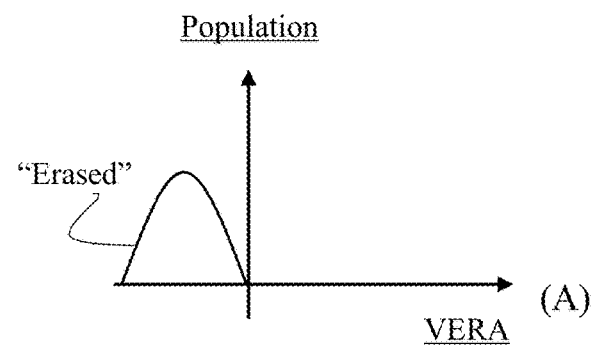
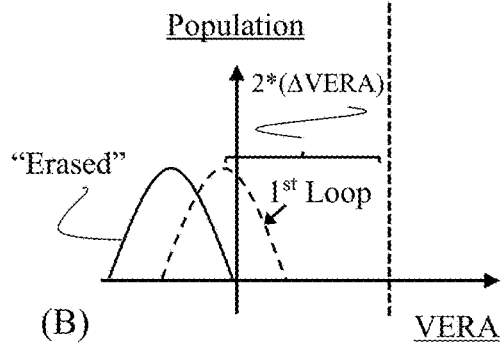
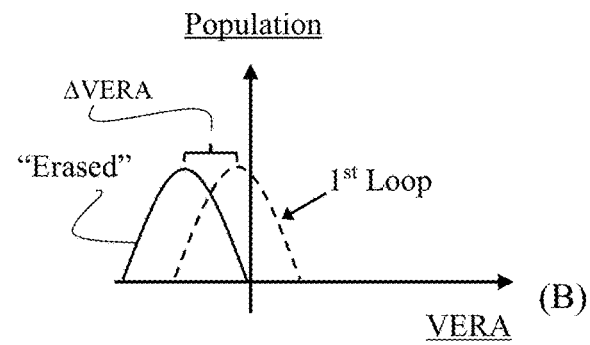
FIG. 13
FIG. 14

VOLATILE MEMORY  NON-VOLATILE MEMORY

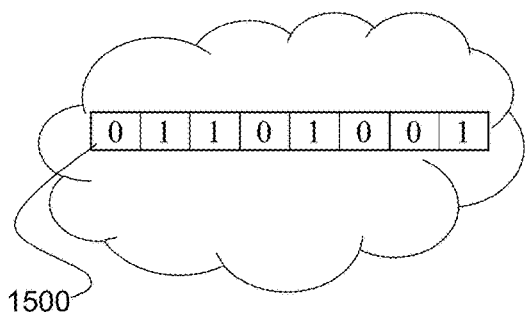 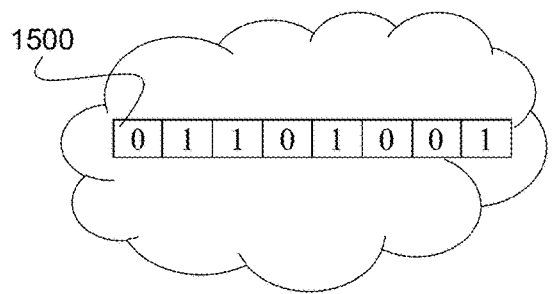

Stage 1: initial VERA (VERA$_i$) stored in both locations.

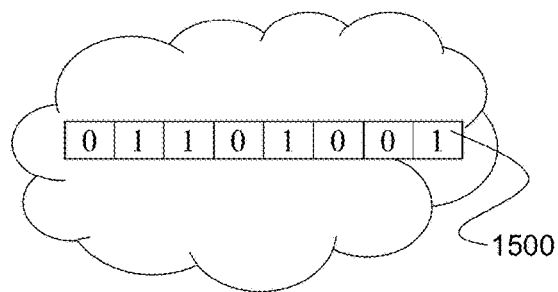 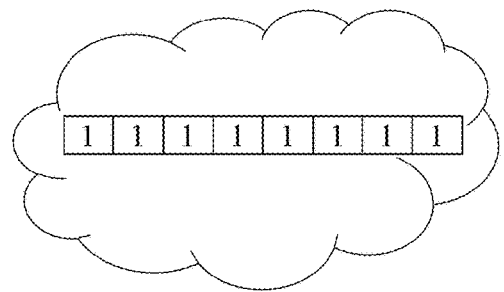

Stage 2: initial VERA (VERA$_i$) remains in volatile memory while the non-volatile memory is erased.

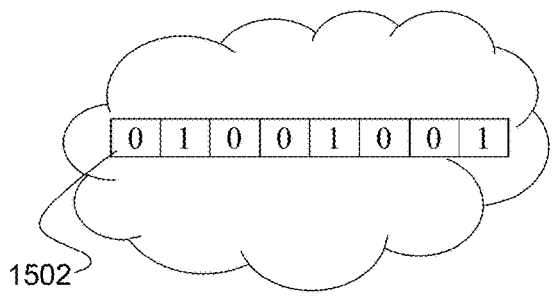 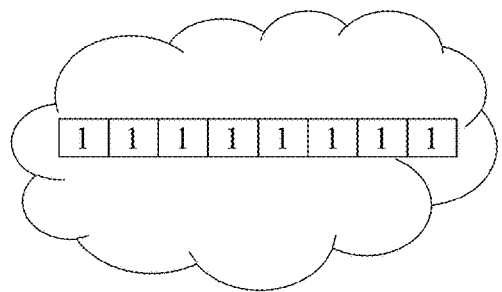

Stage 3: adjusted VERA stored in volatile memory while the non-volatile memory remains erased.

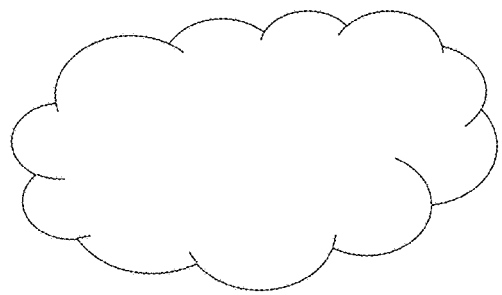 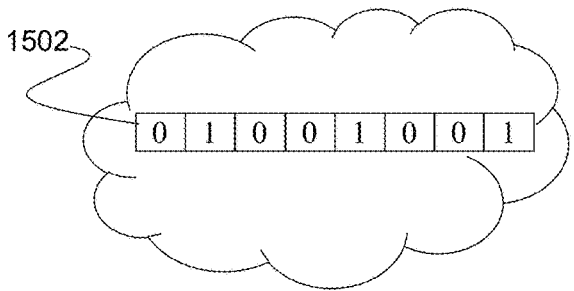

Stage 4: adjusted VERA written to non-volatile memory and volatile memory is released for other programming.

*FIG. 17*

SMART ERASE VERIFY IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to compensatory systems and methods for erase operations in non-volatile memory structures, wherein the memory structures are experiencing slow performance due to structural degradation as a result of a high number of successive programming and erase (P/E) cycles.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein the threshold voltage ($V_{th}$) of the resulting transistor is controlled by and dependent upon an amount of charge that is retained on the floating gate. Specifically, in a switch-like manner, a minimum amount of voltage that must be applied to the control gate before the transistor is activated to permit conduction between its source and drain regions is, therefore, determined by the level of charge that is retained on the floating gate. As a result, bit-value data can be programmed onto and erased from the memory cell by precisely changing the level of charge on a floating gate in order to change the threshold voltage characteristic of the transistor. In an array structure, the memory cells are addressable by word lines (rows) and bit lines (columns).

One type of non-volatile memory storage that is defined by this general structure is referred to as NAND flash memory due to its electrical characteristics, which are based on the NAND logic gate.

As explained in detail below, the number of bits that can be stored in an individual memory cell is dependent upon the number of distinct voltage ranges that may be partitioned within the threshold voltage window of the memory cell. For example, to store one bit of data (referred to as a binary data), the possible threshold voltages of the memory cell are divided into two ranges, wherein the ranges are assigned as logical data "1" and "0" respectively. A memory cell of this type of storage density may be referred to as a "single-level cell" or SLC.

By further partitioning the threshold voltage window of a memory cell into additional distinct voltage ranges, multiple levels of information can be stored. Such a memory cell may be referred to as a "multi-state cell." For example, to store two bits of data, the threshold voltage window of a cell may be partitioned into four distinct voltage ranges (or states), wherein each range is assigned a certain bit value that is equal to, for example, "11," "10," "01," and "00." Accordingly, after an erase operation, the threshold voltage is negative and, therefore, may be defined as logic "11." Therefore, the positive threshold voltages may be used for the states of "10," "01, "00." A memory cell of this storage density may be referred to as, for example, a "multi-level cell" or MLC. In another example, to store three bits of data, the voltage threshold window of a cell may be partitioned into eight distinct voltage ranges (or states), wherein each range is assigned a certain bit value that is equal to, for example, "111," "110," "100," "010," "011," "000," "001," and "101." A memory cell of this storage density may be referred to, for example, as a "tri-level" or "triple-level cell" (TLC). In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure.

The specific relationship between the data that is programmed into a memory cell and the threshold voltage levels of the memory cell depends upon the data encoding scheme that is adopted for the memory cells.

As described in detail below, a characteristic of the transistor-type behavior of a non-volatile memory is that in order to be programmed, the programmed cells must first be in an "erased" state. In other words, it is not possible to reprogram an already-programmed memory cell in order to store a new set of data without first performing an erase operation to place the memory cell into an "erased" state. Therefore, depending upon the application of the memory device, a memory cell may endure anywhere in the range of, for example, 1,000 to 300,000 successive programming and erase (P/E) cycles during the lifetime of the memory device. According to certain observations, the semiconductor materials (e.g., the oxide layer(s)) comprising a memory cell may begin to degrade over time due to the sheer wear-and-tear experienced when heavily cycled. As a result of the material degradation, the electrical (or conductive) properties/behaviors of the memory cell may begin to change and become less efficient. One example of this significant impact is with respect to the number of erase loops required to place a memory cell into the "erased" state within an erase cycle. As observed, the number of required erase loops may substantially (and, in some cases, dramatically) rise once a memory cell has undergone a number of P/E cycles falling within a certain number range. This increase in erase loops diminishes the erase speed of the memory device. Further, it may also elevate the threshold voltage ($V_{th}$) of the memory cell(s) as a result of the multiple stepwise increases in the erase voltage (VERA) level that aggregate over the successive erase loops. As such, there is a considerable risk of over-programming the memory device as well, leading to inefficiencies in programming speed and power consumption. Thus, it would be beneficial to derive and identify methodologies for dynamically adjusting or correcting the erase voltage (VERA) level being applied to a memory cell upon detecting that the number of erase loops required to place the memory cell into an "erased" state indicates that the memory cell is either experiencing a wear-and-tear degradation (thereby losing its efficiency) or an over-aggressive erase voltage (VERA) level.

SUMMARY

Various embodiments include a method for dynamically adjusting an erase voltage (VERA) level to be applied in a subsequent erase cycle of a non-volatile memory structure, wherein the method comprises: in a current erase cycle, initiating a current erase/verify loop by applying an initial stored erase voltage level according to an erase sequence in which each successive erase/verify loop is incremented by a pre-determined voltage amount, storing an erase/verify loop count, and making a determination as to whether the current erase cycle is complete according to a pass criterion. If the current erase cycle is complete, a determination is made as to whether the stored erase/verify loop count equals a pre-defined threshold count. Further, if the stored erase/verify loop count does not equal the pre-defined threshold count, the initial stored erase voltage level is adjusted such that, upon applying the adjusted erase voltage level in a subsequent erase cycle, an erase/verify loop count will now equal the pre-defined threshold count.

Other embodiments include a memory controller, wherein the memory controller comprises a first communication pathway that is configured to couple to a non-volatile memory structure. In addition, the memory controller is configured to, in a current erase cycle, initiate a current erase/verify loop by applying an initial stored erase voltage level to the non-volatile memory structure according to an erase sequence in which each successive erase/verify loop is incremented by a pre-determined voltage amount, store an erase/verify loop count, and make a determination as to whether the current erase cycle is complete according to a pass criterion. If the current erase cycle is complete, the memory controller is further configured to make a determination as to whether the stored erase/verify loop count equals a pre-defined threshold count. If the stored erase/verify loop count does not equal the pre-defined threshold count, the memory controller is further configured to adjust the initial stored erase voltage level such that, upon applying the adjusted erase voltage level in a subsequent erase cycle, an erase/verify loop count will now equal the pre-defined threshold count.

Additional embodiments include a non-volatile memory system, wherein the system comprises a memory structure and a memory controller that is coupled to the memory structure, with the memory controller, in a current erase cycle, initiating a current erase/verify loop by applying an initial stored erase voltage level according to an erase sequence in which each successive erase/verify loop is incremented by a pre-determined voltage amount, storing an erase/verify loop count, determining if the current erase cycle is complete according to a pass criterion and, if the current erase cycle is complete, determining if the stored erase/verify loop count equals a pre-defined threshold count and, if the erase/verify loop count does not equal the pre-defined threshold count, adjusting the initial stored erase voltage level such that, upon application of the adjusted erase voltage level in a subsequent erase cycle, an erase/verify loop count will now equal the pre-defined threshold count.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 12 is a graphical illustration of the correlation between a number of erase loops required to arrive at an "erased" state of a given memory cell and the number of P/E cycles experienced by the memory cell, in accordance with exemplary embodiments;

FIG. 13 depicts a process for adjusting an initial erase voltage (VERA) level applied during a subsequent erase cycle of a given memory cell in order to decrease a number of erase loops required to arrive at an "erased" state of the memory cell, in accordance with exemplary embodiments;

FIG. 14 depicts a process for adjusting an initial erase voltage (VERA) level applied during a subsequent erase cycle of a given memory cell in order to increase a number of erase loops required to arrive at an "erased" state of the memory cell, in accordance with exemplary embodiments;

FIG. 17 depicts stages of the storage of the initial erase voltage (VERA) level data as occurring during the process depicted in FIG. 16, in accordance with exemplary embodiments.

DETAILED DESCRIPTION

Figure 1:
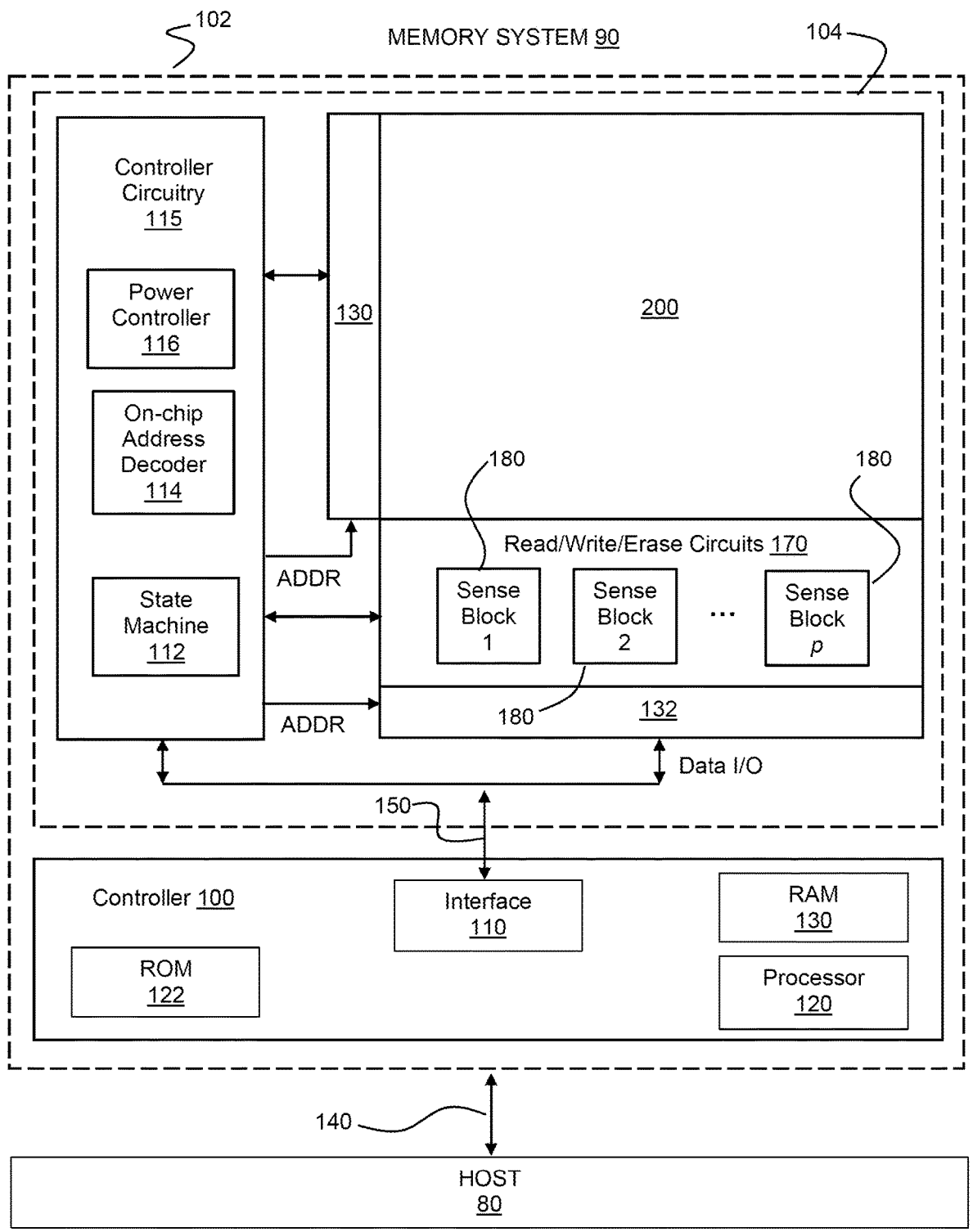
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
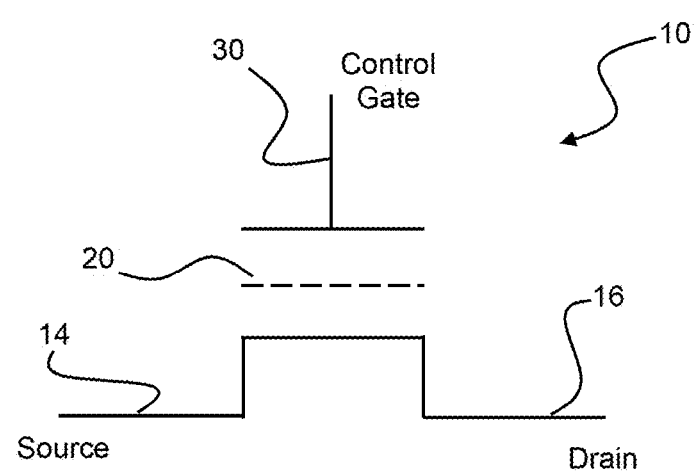
FIG. 2 schematically depicts a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3A:
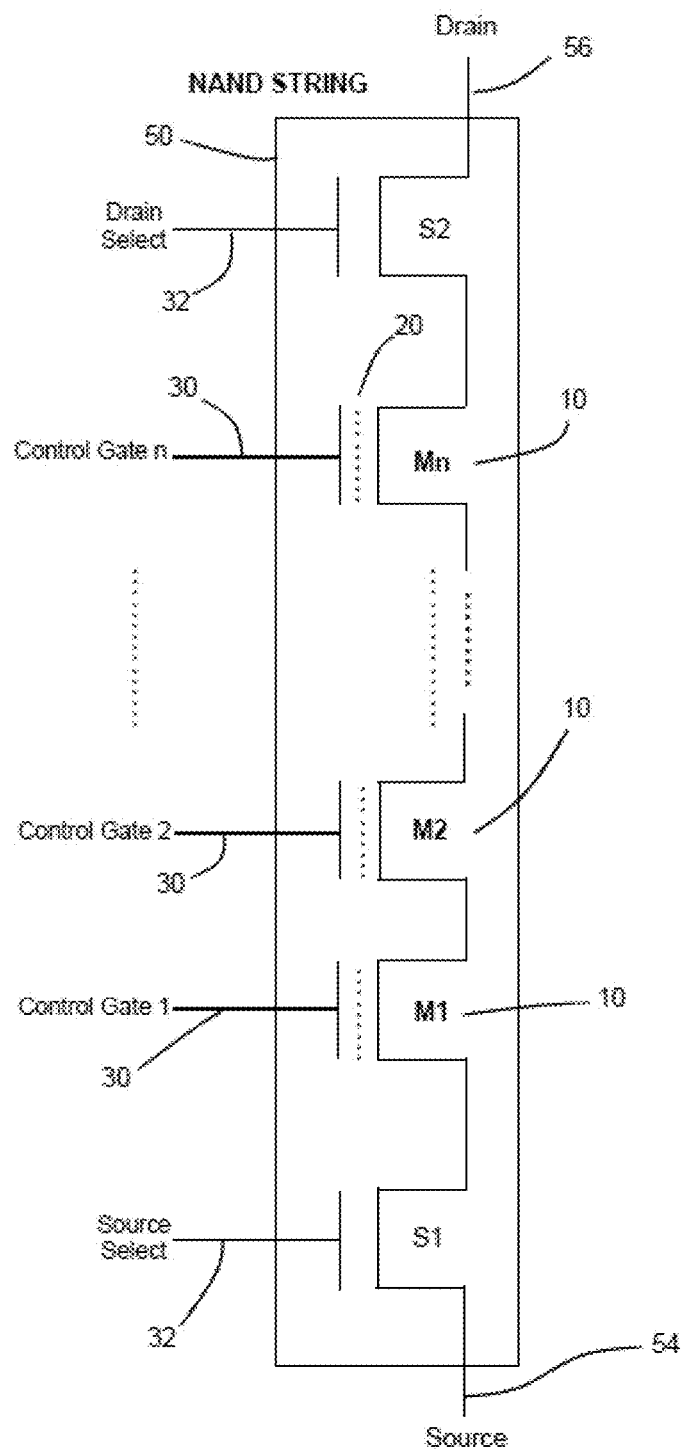
FIG. 3A schematically depicts a series of NAND-type memory cells organized into a string, in accordance with exemplary embodiments.

According to certain exemplary embodiments, the individual memory cells 10 are organized into strings in which the memory cells are placed in series. For example, depicted in FIG. 3A is an exemplary embodiment of a string 50 comprising NAND-type memory cells in which the series of the cells' respective transistor elements M1, M2, . . . , Mn (wherein "n" may equal 4, 8, 16, or higher) are daisy-chained with respect to their sources and drains. Further, as mentioned above with respect to FIG. 2, each memory cell's transistor 10 in the string 50 has a charge storage element 20 (e.g., a floating gate) for storing a certain amount of charge so as to represent an intended memory state of that cell, wherein each memory transistor 10 comprises a control gate 30 that allows control over the read and write memory operations. Present at the source terminal 54 and the drain terminal 56 of the string 50 are select transistors S1, S2 that control the transistor's connection to the outlying memory array. Specifically, when the source select transistor S1 is turned on, the source terminal 54 of the string 50 is coupled to a source line (SL). Likewise, when the drain select transistor S2 is turned on, the drain terminal 56 is coupled to a bit line (BL) of the memory array.

Figure 3B:
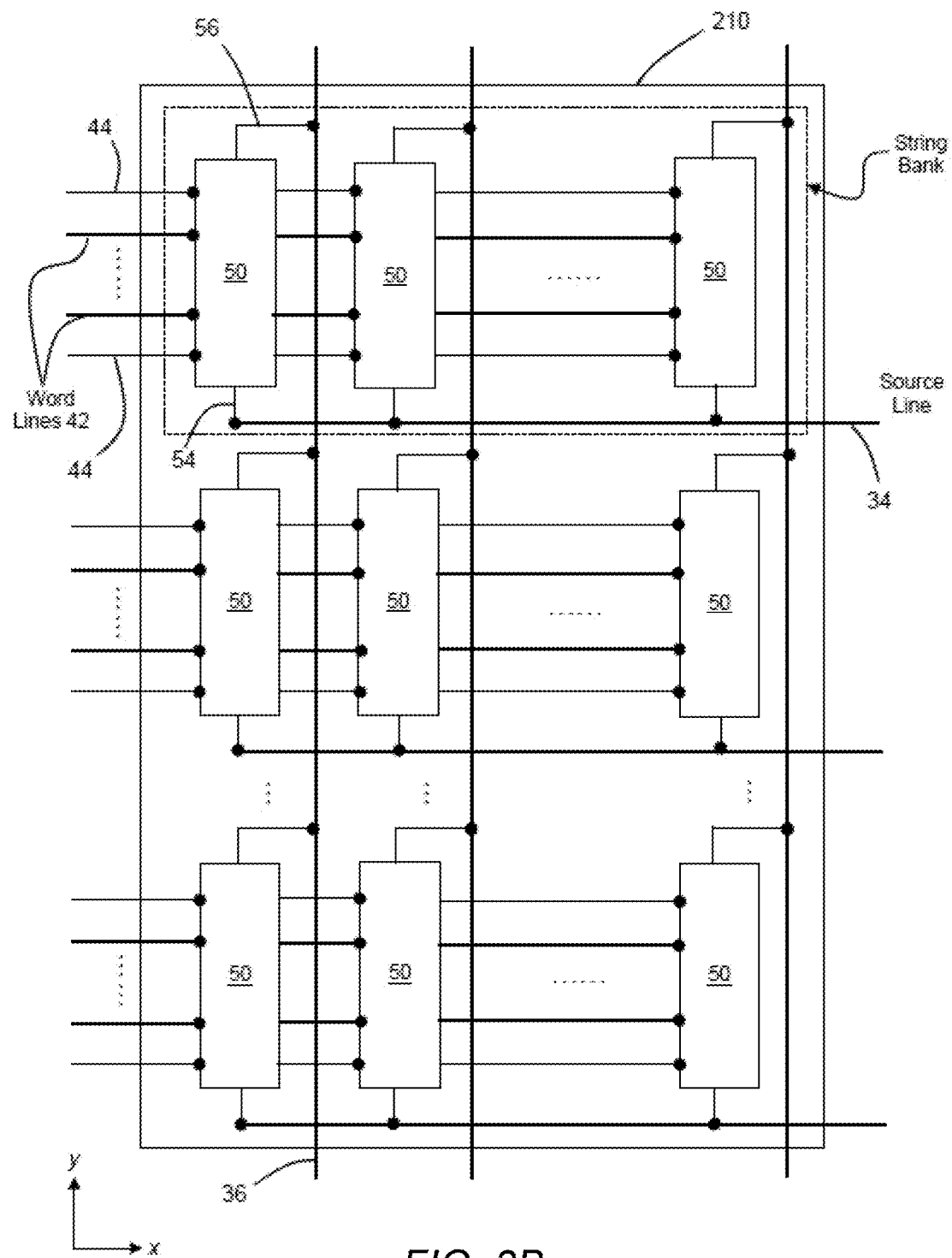
FIG. 3B schematically depicts a two-dimensional array of memory cells, comprising a plurality of NAND-type strings, such as the type depicted in FIG. 3A, in accordance with exemplary embodiments.

Expanding outward a hierarchical level, FIG. 3B is a schematic diagram depicting an exemplary embodiment of a memory array 200 (such as memory array 210) comprised of a plurality of NAND strings 50 of the type illustrated in FIG. 3A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Figure 4:
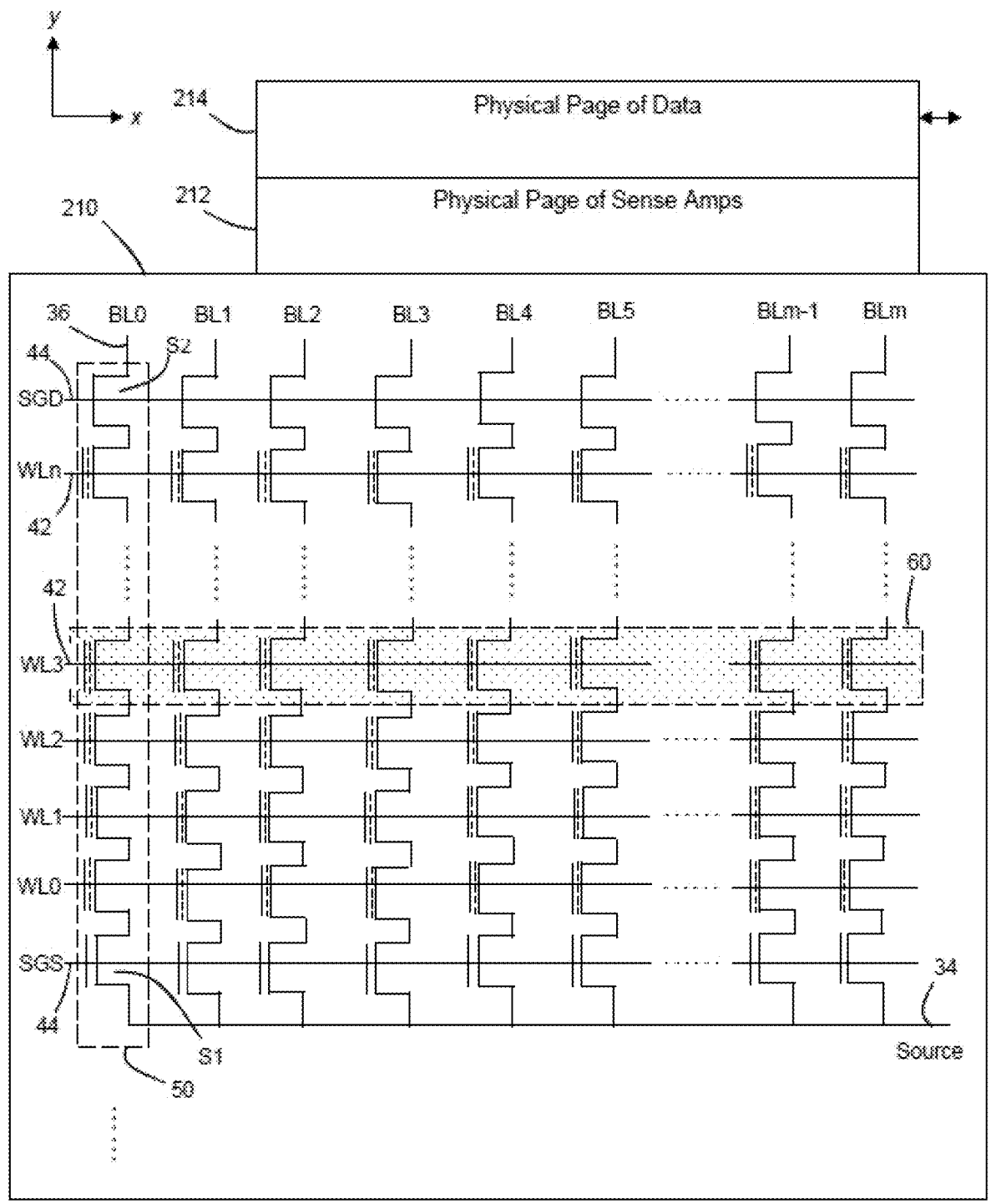
FIG. 4 depicts a page of memory cells being sensed or programmed in parallel, and in relation to a memory array organized in a NAND-type configuration, in accordance with exemplary embodiments.

Referring now to FIG. 4, there is depicted a detailed illustration of one bank of NAND strings 50 of a memory array 210 according to an exemplary embodiment thereof. This view is particularly useful in visualizing a row-by-row configuration of the memory array 210, wherein each row may be referred to as a "page." Accordingly, a physical page (e.g., page 60 denoted in FIG. 4) is a group of memory cells 10 that is enabled to be sensed or programmed in parallel. In fact, in such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm−1, and BLm, as depicted in FIG. 4). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 5:
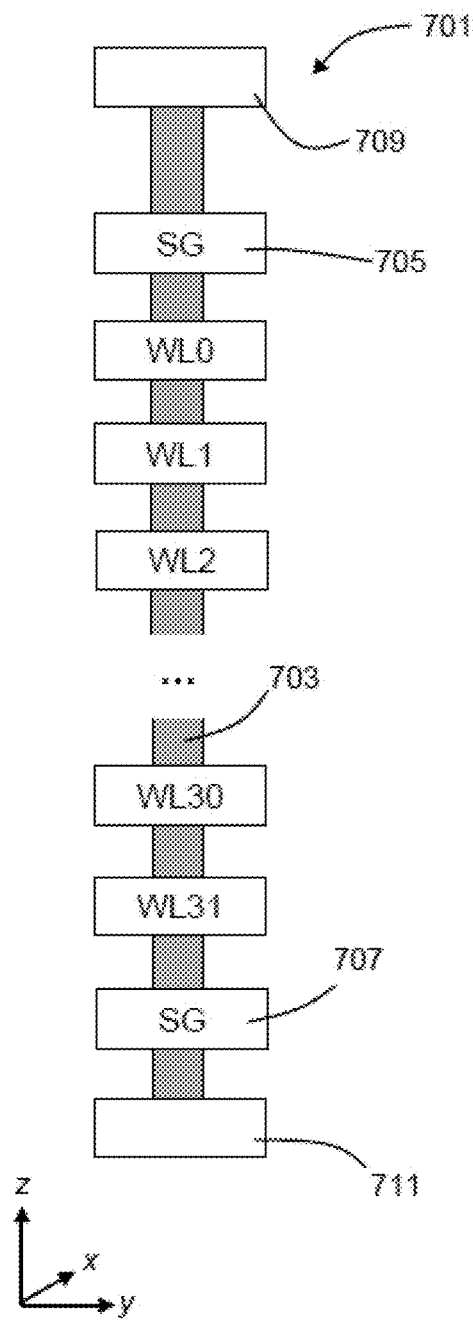
FIG. 5 depicts a vertical NAND-type string, in accordance with an exemplary embodiment.

In FIGS. 3A-3B and 4 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 5 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 5, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 3A-3B, 4 and 5, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by the row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 3A-3B and 4, respectively, in the vertical direction that is perpendicular to the x-y plane (i.e., the z direction), such that each y-z plane of the three-dimensional structure corresponds to the page structure of FIG. 4, wherein each plane is at differing locations along the x axis. As a result, the global bit lines (e.g., BL0, . . . , BLm, of FIG. 4) each run across the top of the memory structure to an associated sense amplifier (e.g., SA0, . . . , SAm). Accordingly, the word lines (e.g., WL0, . . . , WLn, of FIG. 4), and the source and select lines (e.g., SSL0, . . . , SSLn, and DSL0, . . . , DSLn, respectively) extend in the x direction, with the bottom of each NAND string (e.g., string 50) connected to a common source line.

Figure 6:
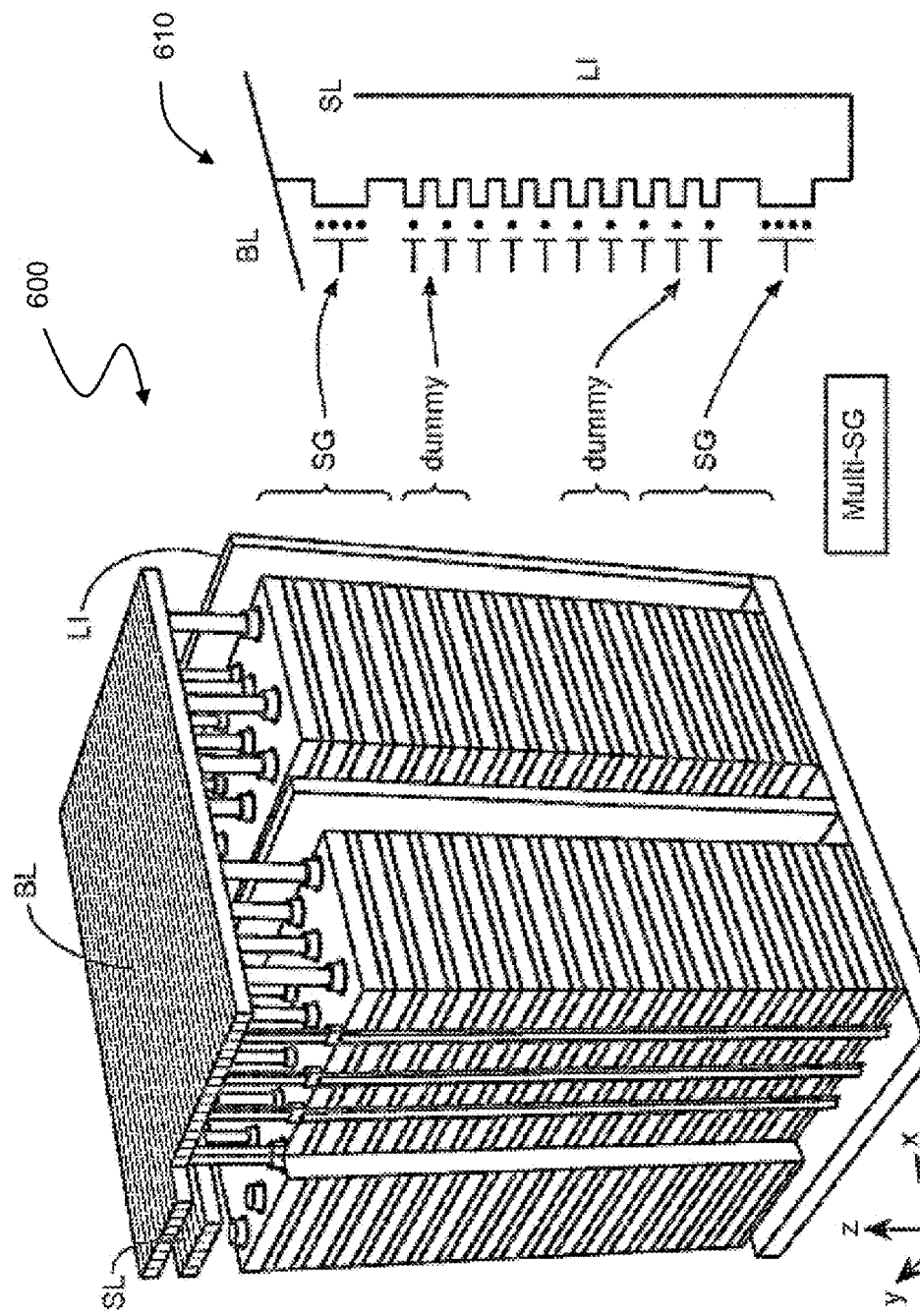
FIG. 6 is a perspective view of a representative subsection of a monolithic three-dimensional NAND-type memory array, in accordance with exemplary embodiments.

Referring now to FIG. 6, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 3B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 6 is a schematic representation of the fundamental elements of one of the vertical NAND strings 610 of the memory array 600. Similar to the NAND string 50 of FIG. 3A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 7:
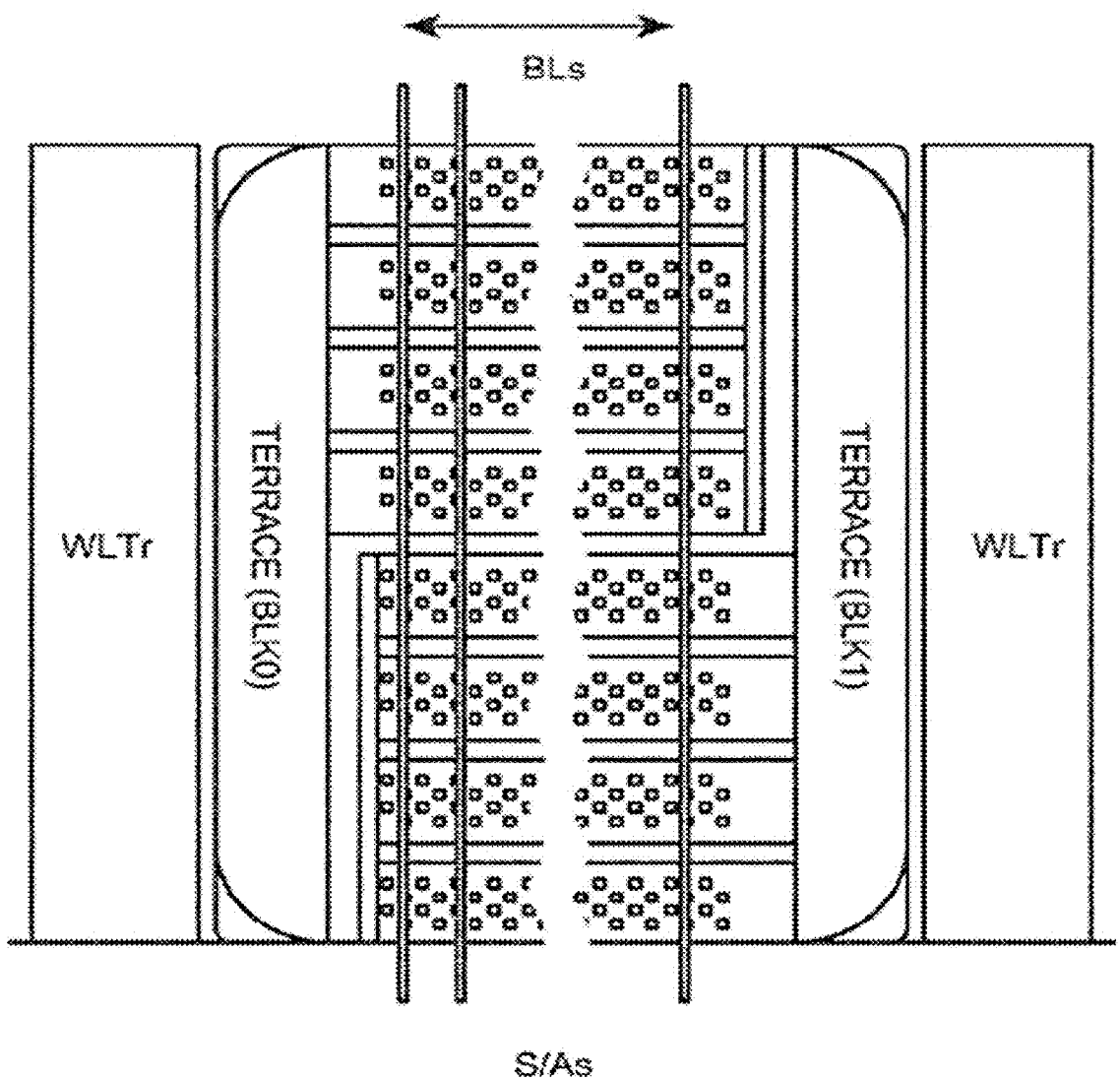
FIG. 7 is a top view of two representative blocks of the memory array of FIG. 6, in accordance with exemplary embodiments.

Turning to FIG. 7, there is shown a top view of two representative blocks (i.e., BLK0 and BLK1) of the array structure 600 of FIG. 6. According to this particular embodiment, each block is comprised of four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

Figure 8:
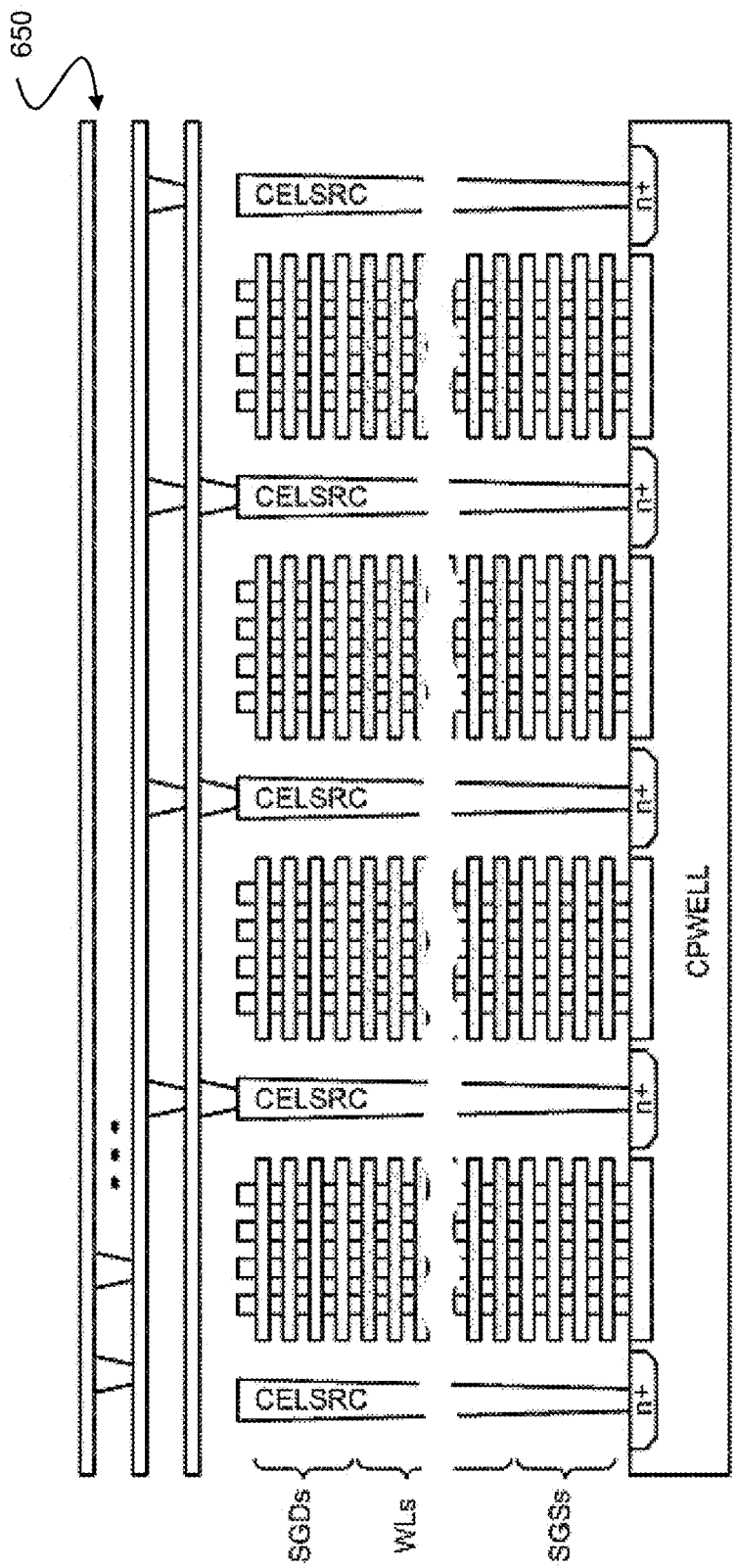
FIG. 8 is a side view of a representative block of the memory array of FIG. 6, in accordance with exemplary embodiments.

The side view provided in FIG. 8 shows the four extensions of an individual block 650 of the array structure 600 of FIG. 6 in greater detail. According to this particular embodiment, select gates (SGD, SDS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Figure 9A:
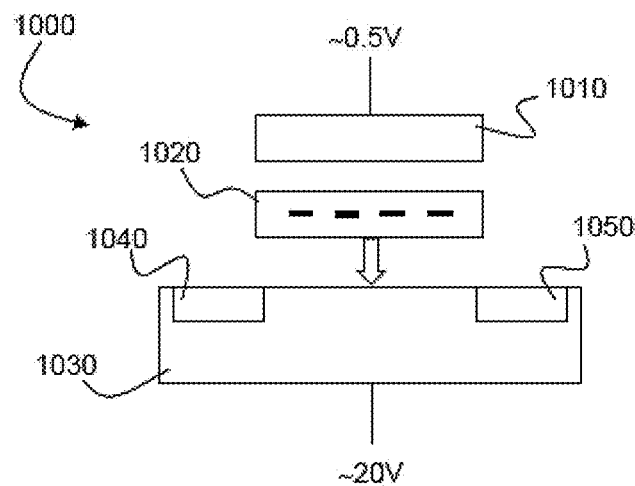
FIG. 9A illustrates a memory erase operation for a programmable threshold transistor of a two-dimensional memory structure, in accordance with exemplary embodiments.
Figure 9B:
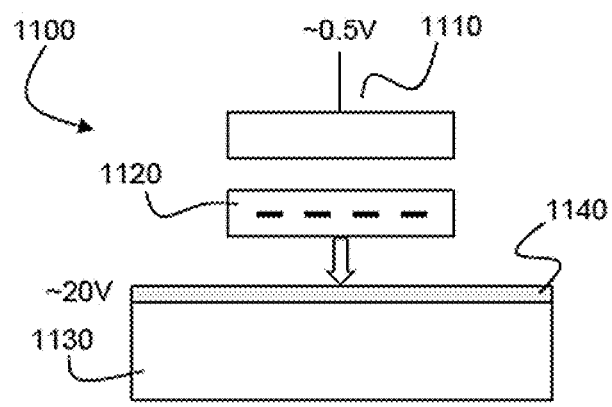
FIG. 9B illustrates a memory erase operation for a programmable threshold transistor of a three-dimensional memory structure, in accordance with exemplary embodiments.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate. This process is diagrammatically illustrated in FIG. 9A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to substrate body 1030, causing the electron charges (−) trapped at the floating gate 1020 to be pushed back into substrate 1030. Similarly, depicted in FIG. 9B is a diagrammatic view of a general erase process with respect to a three-dimensional NAND-type memory cell configuration 1100, according to an exemplary embodiment. Here, a relatively low voltage (e.g., ~0.5 V) is applied to the appropriate word line 1110 and a relatively high voltage VERA (e.g., ~20 V) is applied to a channel 1140 of the memory structure 1130, the channel being comprised of holes. As a result, the electron charges (−) are pushed out of the charge trapping layer 1120.

As described above, global bit lines (BLs) of a memory array structure connect the memory cells to the sense amplifiers used in the memory (sensing) operations. For example, as described above with respect to the exemplary embodiment illustrated in FIG. 7, each NAND string is connected to a bit line and the sense amplifiers (SAs) are located on the periphery of the array 600, wherein each sense amplifier connects to a single bit line. During erase operations in some memory circuit designs, such as the exemplary BiCS-type array embodiment depicted in FIGS. 6-8, the associate bit lines (BLs) will couple to the erase voltage VERA, which can be in the relatively high voltage range of 20V to 24V, thereby taking the bit lines to a high voltage. However, the sense amplifiers (SAs) generally operate at lower voltages, such as VSS (0V), the high logic level (VDD≈2-3V), and, in some embodiments, a VDDSA (used in pre-charging bit lines for sensing operations) that is in the 4-5V range. Therefore, additional circuitry is implemented in order to protect the transistors of the sense amplifiers (SAs) from being damaged by the high erase voltage, and to protect against bit lines shorting to the adjacent low voltage circuitry. For example, in certain embodiments, each of the bit lines may be connected to an associated sense amplifier through a switch by an internal part of the bit line such that, during an erase operation, the switch is shut off thereby protecting the sense amplifier circuitry and containing the high voltage.

Figure 10A:
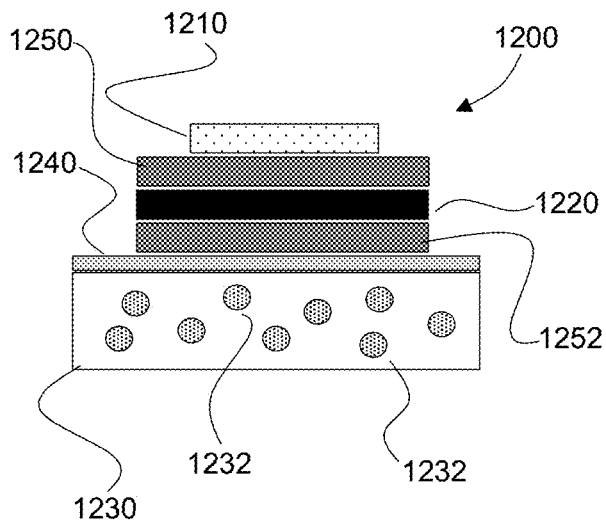
FIG. 10A schematically depicts an "erased" state of a single or a relatively low-cycled three-dimensional NAND-type memory cell, in accordance with exemplary embodiments.
Figure 10B:
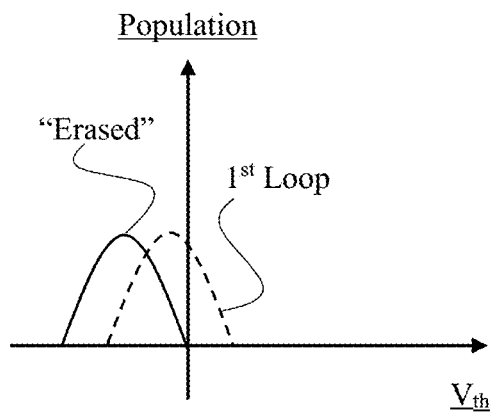
FIG. 10B is a distribution plot that depicts an erase operation performed with respect to the memory cell of FIG. 10A, in accordance with exemplary embodiments.
Figure 11A:
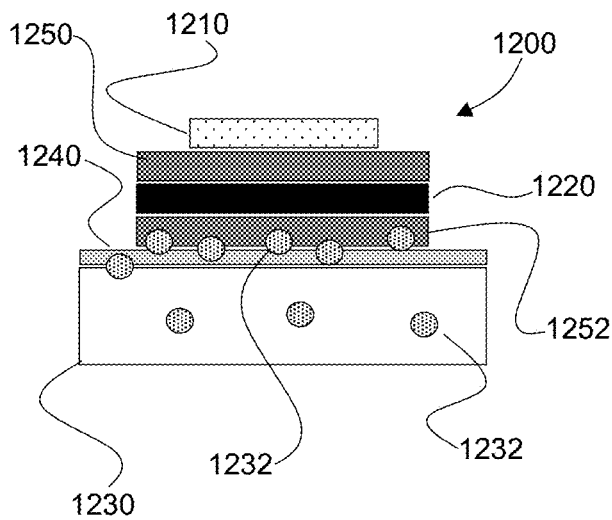
FIG. 11A schematically depicts an "erased" state of a relatively high-cycled three-dimensional NAND-type memory cell, in which the memory cell is exhibiting material degradation, in accordance with exemplary embodiments.

As mentioned above, depending upon the nature of the memory structure, it is possible that in use, the memory structure is consistently being written and erased in order to store data over a course of many programming and erase (P/E) cycles. In particular, with respect to SLC-type memory cells, which are used to store binary data and are programmed and erased using a single loop, the number of P/E cycles may range, for example, from 10,000 to 300,000 cycles. According to experimental and actual observations of these non-volatile memory structures, structural degradation of the semiconductor material(s) comprising the memory cells begins to occur as a function of wear-and-tear over the course of numerous successive P/E cycles and increases significantly in correlation to the number of P/E cycles. The structural degradation of the semiconductor material(s) may result in various modifications or damage to the electrical function and/or properties of the semiconductor material(s), thereby adversely affecting the electric conductive behavior of the distressed memory cell structure(s). For example, it may be possible that, as a consequence of the degraded semiconductor material(s)—in particular, the tunnel oxide layer comprising an insulating layer—an electron flux develops causing an inefficiency or lag in the tunneling movement of the electrons to and from the semiconductor substrate during programming and erase operations. Reference is made to FIGS. 10A and 11A, which depict a structural illustration of this electron flux phenomenon by way of general explanation. In FIG. 10A, there is shown a basic depiction of a three-dimensional NAND-type memory cell 1200 of an example memory block, wherein the memory cell 1200 is in an erased state following a single P/E cycle or after a relatively low number of P/E cycles (i.e., a "fresh block"). As shown, the example memory cell 1200 may be comprised of one or more material layers that may include a control gate 1210, a floating gate 1220 (or a charge trapping layer) disposed between two insulating layers 1250, 1252, a channel 1240, and an underlying semiconductor substrate 1230. The two insulating layers 1250, 1252 may be comprised of an oxide material. In this example, as expected, all of the electrons 1232 are propelled into the semiconductor substrate 1230 following an erase operation. In correlation, the graph or plot provided in FIG. 10B indicates generally a threshold voltage ($V_{th}$) distribution of an example population comprised of memory cells of a representative memory block, wherein the memory cells are of the type and state of the memory cell 1200 depicted in FIG. 10A. As indicated, according to this particular example, two erase/verify loops are necessary to empty the cells' charge trapping layers (e.g., 1220 in FIG. 10A) of electron charge(s) in order to arrive at the "erased" state.

Figure 11B:
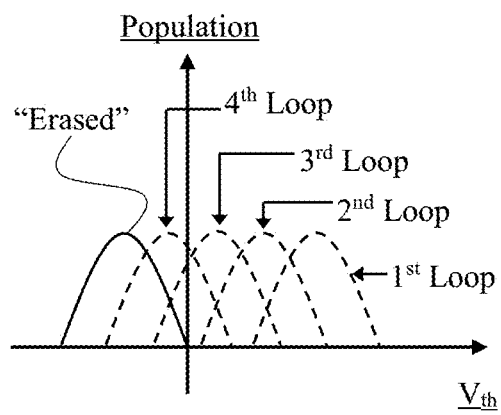
FIG. 11B is a distribution plot that depicts an erase operation performed with respect to the memory cell of FIG. 11A, in accordance with exemplary embodiments.

By comparison, referring now to FIG. 11A, there is shown the identical memory cell 1200 from the depiction in FIG. 10A, subsequent to a relatively high number of P/E cycles. As indicated, due to a wear-and-tear structural degradation in the semiconductor material(s) (e.g., within the oxide layer 1252), an electron flux is occurring that causes a portion or all of the electrons 1232 to become temporarily or permanently trapped at, for example, the oxide layer 1252, rather than effectively being propelled into semiconductor substrate 1230. As a result of this lagging electron charge, the threshold voltage ($V_{th}$) of the memory cell 1200 is increased. Consequently, there is a decrease in the number of programming pulses needed to program the memory cell to an intended state. Conversely, there is an increase in the number of erase/verify loops are also needed to fully migrate the electrons 1232 to the semiconductor substrate 1230. With each additional erase/verify loop used, the VERA (erase) voltage level is also increased beyond what is initially intended with respect to a "fresh block." As such, certain device performance parameters are negatively affected, including, for example, an increase in power consumption and slow erase speed. Depicted in FIG. 11B is a general example of a threshold voltage ($V_{th}$) distribution of a population of memory cells of a representative example of a relatively highly "cycled" memory block (that may comprise memory cells exhibiting the slow-footed electron tunneling behavior shown in FIG. 11A). As indicated, at the initial point of an erase operation, the memory cells exhibit an increased threshold voltage ($V_{th}$) level (when compared to the plot in FIG. 10B) such that it now requires not just two, but a total of five, erase/verify loops in order for the memory cells to arrive at the "erased" state. According to observations in the field, it is possible that this consequential phenomenon resulting from the material degradation over the course of successive P/E cycles may result in approximately a threefold increase in the programming and/or erase time. Accordingly, at the SSD level, this predicament may lead to a quality of service (QoS) degradation in which the SSD ("solid-state drive") must now issue more program and erase commands interleaved with read I/O (input/output) requests, thereby resulting in an overall slower response time from the memory device.

By way of further explanation, FIG. 12 generally depicts an example of the physical correlation between the total number of erase/verify loops that are required for a given memory cell to arrive at the "erased" state and the increasing number of P/E cycles experienced by the memory cell over time.

Importantly, it is also noted that the level of material degradation experienced within a single memory device may vary. For example, the level of material degradation (or the effect therefrom) caused by successive P/E cycles may be inconsistently experienced on a die-by-die, wafer-by-wafer, or block-by-block basis or level. Therefore, in determining a solution to this challenge, it is difficult to derive a "universal" solution that may be uniformly applied across a single, and across multiple, memory device(s). In certain memory device embodiments, an effective wear leveling technology may be suitably incorporated therein, thus increasing the probability that there is a relatively small block-to-block variation in the number of P/E cycles undertaken and, thus, the material degradation level(s) within a single memory device. Under such circumstances, it may be possible to more broadly apply a truly efficacious solution at the chip level.

For example, FIGS. 13 and 14 depict an exemplary embodiment of an algorithmic solution that can be dynamically applied at a chip-wide level that addresses the wear-and-tear symptoms of an increasing erase/verify loop count and a corresponding lag in the programming and/or erase speed that were discussed above. Again, a chip-wide level solution such as this assumes that the subject memory device at issue comprises effective wear-leveling technology such that any variation in material degradation and in the number of P/E cycles between the memory blocks is minimal or within a certain or pre-defined threshold range. From a general concept view, the exemplary embodiment depicted in FIGS. 13 and 14 aims to, with respect to each erase/verify loop, ascertain the number of erase/verify loops conducted during an erase operation of a memory device, and, should that number exceed or fall below a pre-defined threshold count, an adjustment is subsequently made to the erase voltage (VERA) level that is applied on the next erase loop in order to conform the total number of erase/verify loops to the pre-defined threshold count. In this way, the problematic issues of an excess number of erase/verify loops or, conversely, an over-aggressive VERA level that overshoots the intended threshold voltage ($V_{th}$) distribution of the memory device, are either quickly corrected or are entirely avoided. The pre-defined threshold erase/verify loop count may be determined, for example, by experimental observations and data and any suitable threshold count may be used. For example, a suitable threshold count may be the number of erase/verify loop(s) required to arrive at the "erased" state in a "fresh" memory block of the subject memory device, wherein a "fresh" memory block may be defined as a block that has experienced a single P/E cycle or a relatively low number of P/E cycles.

In the particular embodiment depicted in FIGS. 13 and 14, the pre-defined threshold count is, for purposes of general illustration, set at two erase/verify loops. Accordingly, in this specific example, a total of two erase/verify loops in order to complete an erase operation is deemed optimal for this particular memory device. Thus, at each erase/verify loop conducted, a determination is made as to whether the ascertained loop count either meets, exceeds, or falls below the pre-defined threshold count of a total of two loops. In the case in which the clocked loop count is equal to two, this is a good indication that the initial VERA level being applied according to the intended erase sequence is optimal for the memory device at the present time. However, in the event that the clocked loop count is greater to, or less than, the pre-defined threshold loop count of two, this signifies that the applied VERA level should be increased or decreased in order to compensate for any physical and/or electrical changes that are presently occurring in the memory device. FIG. 13 illustrates the case in which the clocked number of erase/verify loops exceeds the pre-defined threshold count of two loops. As depicted by the distribution plot that is set forth in area (A) of FIG. 13, a current erase operation of the subject memory device according to this specific example required a total of four erase/verify loops in order to arrive at the "erased" state, wherein the erase voltage (VERA) level was increased in a stepwise manner by a pre-determined voltage amount (ΔVERA) at each successive erase/verify loop. To ensure that the aggregate total of erase/verify loops that are needed to arrive at the "erased" state in the next erase operation will instead equal the pre-determined threshold loop count, the starting VERA level that is to be applied during the next erase operation may be dynamically calculated at each erase cycle according to the following equation:

$$\text{Adjusted VERA} = \text{Initial VERA} + [((\text{number of loops}) - (\text{threshold loop count}))^* \Delta \text{VERA}]. \quad \text{Equation \#1:}$$

Accordingly, the result of this calculation is an increase in the starting VERA level, which will effectively shorten the voltage range (and thereby lower the number of erase/verify loops) that must be traversed in order to arrive at the "erased" state. The distribution plot provided in area (B) of FIG. 13 illustrates the result of application of this equation to the starting VERA level applied during the next erase cycle with respect to this specific example memory device. Given that the total number of erase/verify loops required to arrive at the "erased" state at this present time is four loops (see area (A) of FIG. 13) and the pre-defined threshold count is two loops as described above, the adjusted VERA level to be applied as the starting point in the subsequent erase cycle may be determined according to Equation #1 as follows:

$$\text{Adjusted VERA} = \text{Initial VERA} + [((4)-(2))^* \Delta \text{VERA}]$$
$$= \text{Initial VERA} + 2^* \Delta \text{VERA}.$$

Accordingly, as indicated in area (B) of FIG. 13, the VERA level at which the first erase/verify loop is initiated in the subsequent erase cycle differs from the VERA level at which the first erase/verify loop of the last erase cycle (see area (A) of FIG. 13) by a quantity of 2*[ΔVERA]. Therefore, as shown, as a result of this adjusted VERA level, only two erase/verify loops are required in order to arrive at the "erased" state, which now satisfies the optimal threshold loop count. By maintaining this optimal threshold loop count at each erase cycle, the issue of performance degradation is substantially avoided.

Turning now to FIG. 14, depicted is the opposite case in which the aggregate total of erase/verify loops required to arrive at the "erased" state is less than the pre-defined threshold count. In this particular example, area (A) of FIG. 14 depicts the circumstance in which only a single erase/verify loop was needed in order to arrive at the "erased" state. In such a case, a correction to this over-aggressive VERA level may be determined according to the following equation:

$$\text{Adjusted VERA} = \text{Initial VERA} - [((\text{threshold loop count}) - (\text{number of loops}))^* \Delta \text{VERA}]. \quad \text{Equation \#2:}$$

Thus, according to this calculation, a decreased VERA level will be applied as the starting point in the next erase cycle. Area (B) of FIG. 14 depicts the application of this calculation to the particular parameters of the example memory device of FIG. 13 previously discussed. As indicated in area (B) of FIG. 14, the adjusted VERA level now being applied as the beginning point in the next erase cycle may be determined from Equation #2 as follows:

$$\text{Adjusted VERA} = \text{Initial VERA} - [((2)-(1))^* \Delta \text{VERA}] = \text{Initial VERA} - [\Delta \text{VERA}].$$

Accordingly, as indicated in area (B) of FIG. 14, the VERA level at which the first erase/verify loop is initiated in the subsequent erase cycle is decreased from the VERA level at which the erase/verify loop of the last erase cycle (see area (A) of FIG. 14) by a quantity of ΔVERA, which now satisfies the optimal threshold loop count (i.e., two loops according to this particular example).

Figure 15:
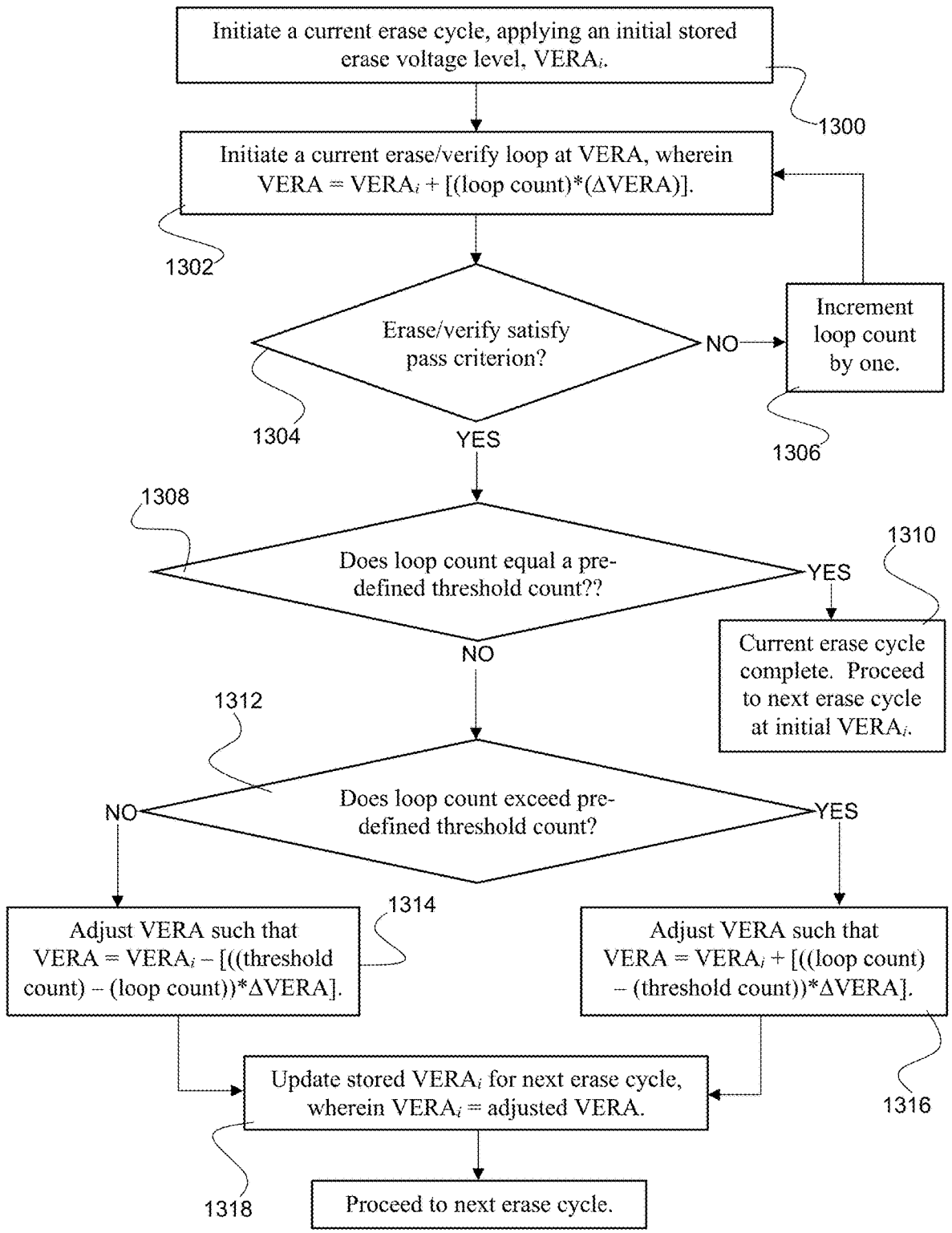
FIG. 15 is a flow diagram generally depicting the process(es) of FIGS. 13 and 14, in which the initial erase voltage (VERA) level is applied uniformly to all memory blocks of a memory structure, in accordance with exemplary embodiments.

Referring now to the flow diagram set forth in FIG. 15, there is depicted a general framework of an exemplary embodiment of the procedure that is described above with reference to FIGS. 13 and 14 for adjusting the erase voltage (VERA) level to be applied on a subsequent erase cycle. Beginning at step 1300, a current erase cycle is initiated wherein an initial stored VERA level, i.e., $\text{VERA}_i$, is applied to a memory device. Specifically, at step 1302, each erase/verify loop of the current erase cycle is conducted at an erase voltage (VERA) level, i.e., VERA, wherein:

$$\text{VERA} = \text{VERA}_i + [(\text{loop count})^*(\Delta \text{VERA})]. \quad \text{Equation \#3}$$

At step 1304, a determination is made as to whether a passing criterion is established at the conclusion of each erase/verify loop. In other words, a determination is made as to whether, for example, the subject memory structure has arrived at the "erased" state. If the criterion is not satisfied, a loop count is incremented (see step 1306) and a subsequent erase/verify loop is initiated. However, if the criterion is satisfied, a determination is made as to whether the loop count is equal to a pre-defined threshold count number (see step 1308). If the loop count does equal the pre-defined threshold count number, the current erase cycle may be considered as complete and any next erase cycle with respect to the memory structure may be initiated at the same initial erase voltage (VERA) level, $\text{VERA}_i$ (see step 1310).

However, if the loop count does not equal the pre-defined threshold count, but rather exceeds the pre-defined threshold count, the erase voltage (VERA) level is thereafter adjusted according to Equation #1 as set forth above (see step 1316). Further, upon determining an "adjusted" VERA level, the stored initial erase voltage level, i.e., $\text{VERA}_i$, to be applied with respect to the next erase operation cycle is updated with the "adjusted" VERA level (see step 1318).

Conversely, if the determination at step 1312 indicates that the loop count does not exceed (i.e., is less than) the pre-defined threshold count, the erase voltage (VERA) level is thereafter adjusted according to Equation #2 as set forth above (see step 1314). Again, upon determining an "adjusted" VERA level, the stored initial erase voltage level, i.e., $\text{VERA}_i$, to be applied at the next erase operation cycle is updated with the "adjusted" VERA level (see step 1318).

With respect to storing the applicable erase voltage (VERA) level where mentioned at the several procedural steps (e.g., at steps 1314 and 1316) of the exemplary embodiment that is outlined in FIG. 15, the applicable VERA level may be stored in any suitable data storage component residing at the memory device. Suitable data storage components may include any component used, for example, to store parameters and other operating information embedded during the construction of the memory device. According to one exemplary embodiment, the VERA level may be stored in a SRAM component (e.g., in a NAND register). However, an important set of key considerations should be made in deciding where the data representing the VERA value(s) could be stored. For example, if stored in a volatile component (e.g., SRAM storage), the data stored therein is lost at every instance in which power to the device is lost. Accordingly, at the beginning of each erase cycle, an initial and additional assessment must be made as to whether a stored VERA level exists, and it may be possible that the benefit of any "adjusted" VERA level determination made previously (according to, for example, the process outlined in FIG. 15) prior to the power loss has now vanished. Further, as mentioned above, the process described with respect to FIGS. 13-15 assumes a slight or non-existent variation in the number of completed P/E cycles (and, by extension, the level of degradation) amongst the programmable memory blocks within a single memory device due to, for example, certain sophisticated wear leveling technology that ensures that the P/E cycles are substantially evenly applied amongst the several memory blocks. Based upon this assumption, it is then possible to apply a uniform VERA level across the multiple memory blocks, thereby making it practical to store the applicable VERA level at a storage location at the device level itself (e.g., SRAM storage). However, in practice, this assumption of minimal block-to-block variation may not always hold true due to, for example, structural defects or poor wear leveling capabilities in a particular memory device. In such a circumstance, it may be beneficial to apply the process outlined above according to the exemplary embodiment depicted in FIG. 15 for dynamically adjusting and updating the applicable VERA level on a per block basis rather than on a device-wide basis. In that case, it would not be practical (e.g., cost-effective) to store each of the individual block-specific calibrated VERA levels in a volatile memory component (e.g., the NAND register/SRAM), wherein the sheer amount of data stored may require, for example, northward of approximately 4000 blocks. Thus, it may be advantageous to store the calibrated VERA level data within a non-volatile memory component of the device that is specifically associated with each discrete block or with a confined region comprising a limited number of blocks. For example, the calibrated VERA information may be logged within a memory array itself (e.g., within a NAND array) using, for example, just eight bits.

Figure 16:
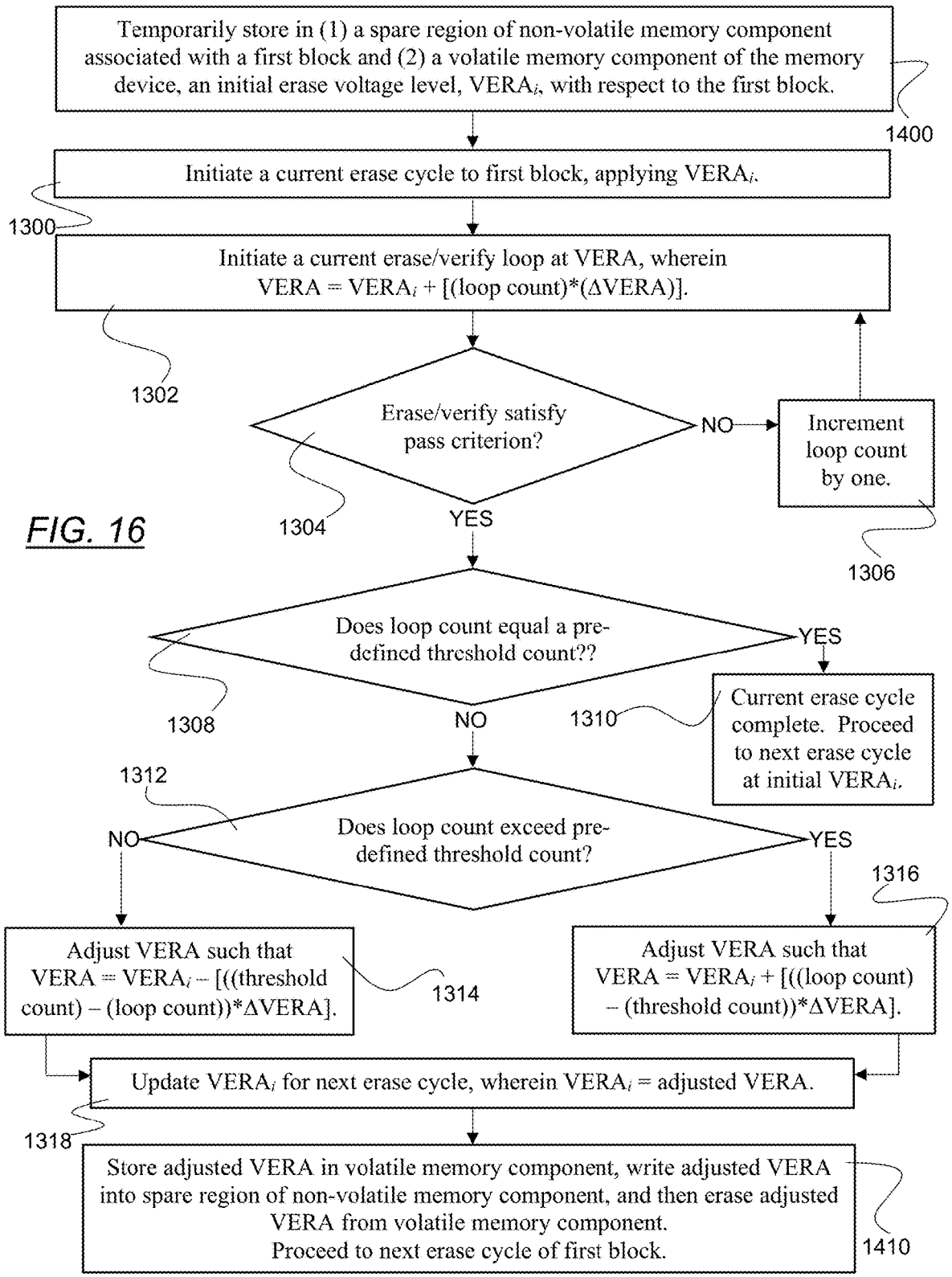
FIG. 16 is a flow diagram generally depicting the process(es) of FIGS. 13 and 14, in which the initial erase voltage (VERA) level applied to a memory block of a memory structure may differ from the initial erase voltage (VERA) level applied to a different memory block of the memory structure, in accordance with exemplary embodiments.

Referring now to FIG. 16, there is depicted a general framework of an exemplary embodiment of a procedure for adjusting the erase voltage (VERA) level to be applied on a subsequent erase cycle upon determining that an erase/verify loop count has not satisfied a pre-defined threshold number. The procedure outlined in FIG. 16 is substantially similar to the procedure of the embodiment set forth in FIG. 15 with the exception that this process may be applied at the block level rather than uniformly across multiple blocks comprising a memory device. In this way, it may be possible to apply this corrective mechanism in a more fine-tuned manner that addresses any significant variations in the number of P/E cycles experienced (and associated wear-and-tear) between the blocks within a memory device. However, as previously discussed, dynamically storing the applicable VERA level for each block could consume a significant amount of memory. Therefore, as a practical matter, it would be beneficial to store each applicable VERA level at a storage location associated with its respective block. For example, each applicable VERA level may be stored within a spare column of a memory array (e.g., NAND array) associated with, or comprising, the respective block. In the circumstance in which the spare storage location is comprised of non-volatile memory cells of the block, the challenge arises that the non-volatile memory must first be erased before any new data may be written. Accordingly, due to the fact that the applicable VERA level information may be erased at each erase cycle, the applicable VERA level must still be temporarily stored within a volatile memory location (e.g., NAND register/SRAM) while the non-volatile memory location is refreshed.

Accordingly, at a first step 1400 of a process according to the exemplary embodiment depicted in FIG. 16, an initial erase voltage level, VERA$_i$, with respect to a first block of the memory device, is temporarily stored in (1) a spare region (e.g., column of a NAND array) of a non-volatile memory component associated with the first block, and (2) a volatile memory component of the memory device (e.g., NAND register/SRAM) (as retrieved from the spare region). Thereafter, the process for conducting a current erase cycle with respect to the first memory block and determining if the applicable VERA level should be adjusted upon the next erase cycle remains identical to the steps 1300, 1302, 1304, 1306, 1308, 1310, 1312, 1314, 1316, and 1318 of the exemplary process that is set forth in FIG. 15 and described above. Should the procedure set forth in FIG. 16 result in an adjustment and/or correction being made to the initial VERA level (that is to be applied on the next erase cycle, see step 1318 in FIG. 16), the adjusted VERA level is (1) first stored in the volatile memory component and written from the volatile memory component to the spare region of the just-erased non-volatile memory component associated with the first block, and (2) once the adjusted VERA level data is stored in the non-volatile memory component, it may be erased from the volatile memory component, thereby releasing the volatile memory component for use in other device operation(s) (see step 1410 of FIG. 16).

To better illustrate the changing data of the volatile memory component and a spare region of the non-volatile memory component at various points in time of the process that is described in FIG. 16, FIG. 17 depicts an illustrative example of the data stored in each of the volatile memory component and the non-volatile memory component at four distinct stages. Beginning at a first stage, an initial VERA level 1500 is temporarily stored in both the volatile memory component and the non-volatile memory component prior to initiating a current erase cycle (see step 1400 in FIG. 16). Next, at a second stage, the initial VERA level 1500 is temporarily held in the volatile memory component to ensure that the initial VERA level 1500 is retained while the non-volatile memory component is erased (see step 1302 of FIG. 16). Continuing onward to a stage three in which an adjusted VERA level 1502 has been determined according to step 1318 of the process in FIG. 16, the adjusted VERA level 1502 is initially and temporarily stored in the volatile memory component. Concluding at a stage four, the adjusted VERA level 1502 is written from the volatile memory component to the non-volatile memory component, thereby freeing up the volatile memory component for other data storage (see step 1410 of FIG. 16). Accordingly, upon initiating the next erase cycle of the associated memory block, the adjusted VERA level 1502 is available to be pre-read into the volatile memory component, thereby restarting the changing data storage cycle according to, for example, the embodiment of FIGS. 16 and 17.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:
1. A method for dynamically adjusting an erase voltage level to be applied in a subsequent erase cycle of a non-volatile memory structure, comprising:
  setting an erase voltage level to a starting erase voltage level;

in an erase operation, initiating a current erase/verify loop by applying the erase voltage level according to an erase sequence in which each successive erase/verify loop is incremented by a pre-determined voltage amount;

storing an erase/verify loop count;

determining if the current erase cycle is complete according to a pass criterion;

if the current erase cycle is complete, determining if the stored erase/verify loop count equals a pre-defined threshold count; and if the stored erase/verify loop count does not equal the pre-defined threshold count, adjusting the starting erase voltage level such that in a future erase operation the erase/verify loop count will equal the pre-defined threshold count at completion of the future erase operation.

2. The method according to claim 1, wherein the adjusting comprises one of:

if the stored erase/verify loop count exceeds the pre-defined threshold count, increasing the starting erase voltage level by a quantity that is defined as the pre-determined voltage amount multiplied by the difference between the erase/verify loop count and the pre-defined threshold count; and if the stored erase/verify loop count is below the pre-defined threshold count, decreasing the starting erase voltage level by a quantity that is defined as the pre-determined voltage amount multiplied by the difference between the pre-defined threshold count and the erase/verify loop count.

3. The method according to claim 1, wherein:

the non-volatile memory structure is comprised of a plurality of memory blocks; and the erase voltage level is applied to the entire memory structure.

4. The method according to claim 1, wherein:

the non-volatile memory structure is comprised of a plurality of memory blocks including a first block; and the starting erase voltage level is applied to the first block and may differ from a starting erase voltage level applied to a different memory block of the plurality of memory blocks.

5. The method according to claim 4, further comprising:

prior to initiating the current erase/verify loop, temporarily storing the erase voltage level in:

a spare region of a non-volatile memory component associated with the first block; and a volatile memory component of the memory structure;

storing the adjusted starting erase voltage level in the volatile memory component;

writing the adjusted starting erase voltage level from the volatile memory component to the spare region of the non-volatile memory component; and erasing the adjusted started erase voltage level from the volatile memory component.

6. The method according to claim 5, wherein:

the non-volatile memory component comprises a NAND array; and the volatile memory component comprises a SRAM.

7. The method according to claim 1, wherein the pre-defined threshold count is two loops.

* * * * *